United States Patent [19]
Gabriel et al.

[11] Patent Number: 4,954,212
[45] Date of Patent: Sep. 4, 1990

[54] ENDPOINT DETECTION SYSTEM AND METHOD FOR PLASMA ETCHING

[75] Inventors: Calvin T. Gabriel, Pacifica; James E. Nulty, San Jose, both of Calif.

[73] Assignee: VLSI Technology, Inc., San Jose, Calif.

[21] Appl. No.: 412,697

[22] Filed: Sep. 26, 1989

[51] Int. Cl.$^5$ .................... H01L 21/306; B44C 1/22; C03C 15/00; C03C 25/06
[52] U.S. Cl. .................... 156/627; 156/643; 156/657; 156/662; 156/345; 204/192.33; 204/298.32
[58] Field of Search ............. 156/626, 627, 643, 646, 156/653, 657, 662, 345; 204/192.32, 192.33, 192.35, 192.37, 298.32

[56] References Cited

U.S. PATENT DOCUMENTS

4,207,137 6/1980 Tretola ............................ 156/627
4,357,195 11/1982 Gorin ............................. 156/345

Primary Examiner—William A. Powell
Attorney, Agent, or Firm—Flehr Hohbach Test Albritton & Herbert

[57] ABSTRACT

A plasma etching endpoint detection system and method for plasma etching systems generates an endpoint signal when the etching system completes the etching of a designated layer on a semiconductor wafer and begins etching the layer below the designated layer. An impedance transformation circuit is tuned so that the selected tuning point has a predefined relationship to the point at which minimum power reflection occurs. As a result, when the etching system completes the etching of a designated layer, the amount of power reflected by the plasma etcher will change in a predefined fashion so as to facilitate the generation of an endpoint signal. In one embodiment, a tuning capacitor in the etcher's impedance transformation circuit is set at a level at which it is known that the amount of reflected power will increase when the designated layer has been completely etched. As a result, the intensity of light generated in the plasma will decrease at the endpoint of etching the designated layer. An optical sensor, which is tuned to a frequency at which light is generated while the designated layer is being etched, generates an endpoint signal when the emission intensity decreases below a specified level, and that endpoint signal is used to turn off the etcher's plasma power supply. In another embodiment, the plasma etcher's controller detects when the reflected power increases above a specified level, at which point it generates an endpoint signal that is used to turn off the etcher's plasma power supply.

12 Claims, 4 Drawing Sheets

ENDPOINT DETECTION SYSTEM AND METHOD FOR PLASMA ETCHING

The present invention relates generally to plasma etching processes used in semiconductor circuit manufacturing and particularly to methods and systems for detecting when a plasma etch process has completed the etching of a particular layer on a semiconductor wafer.

BACKGROUND OF THE INVENTION

Plasma etchers are frequently used in semiconductor processing when a relatively straight vertical edge is needed. For instance, when etching the polysilicon gate of a MOS transistor, undercutting the polysilicon can adversely affect the operation of the transistor. Undercutting is frequently encountered when etching is performed using a liquid etching method. Plasma etching, which uses ions accelerated by an electric field, tends to etch only horizontal exposed surfaces and therefore avoids undercutting.

An important aspect of all etching processes is stopping the etching process after the layer being etched has been removed but before the next layer down is destroyed. This is often called "endpoint" detection—for detecting the completion of etching of a particular layer. While the chemicals used in an etching process are selected for their ability to etch a particular type of material, such as polysilicon, the etching chemicals will dissolve the other materials on a semiconductor wafer if those materials are exposed to the etching chemicals for a sufficient period of time. For example, most etching chemicals used to etch polysilicon will also etch silicon oxide. If the silicon oxide used for forming a MOS transistor is completely etched away, the transistor will be destroyed and the wafer being processed will be useless.

In the past, the gate oxides on typical MOS and CMOS circuits have been sufficiently thick (e.g., 500 to 1000 angstroms) that it was relatively easy to stop the polysilicon etching process before the gate oxide overlaying the source and drain regions of transistors was destroyed. However, the device geometries in more advanced circuits have been decreasing in size, resulting in the need for much thinner gate oxides than have been used in the past. At the time of the filing of this document, the assignee of this invention is using gate oxide thicknesses of 200 angstroms on some devices, and is planning to use gate oxides of 175 angstroms or less in the near future.

One consequence of using very thin gate oxides, such as oxides 200 angstroms thick, is that the etching chemical used in a typical plasma etcher when etching polysilicon will attack and destroy the underlying gate oxide much more quickly than when thicker gate oxides were used. In fact, it was found that some wafers were being destroyed by the inadvertent etching of gate oxide, despite the use of an etching system (such as the GCA Waferetch 616 triode etcher) which had state of the art "endpoint" detection equipment. Furthermore, these failures were intermittent. The present invention is the result of the inventors' investigation into the causes of these failures.

Figure 1:
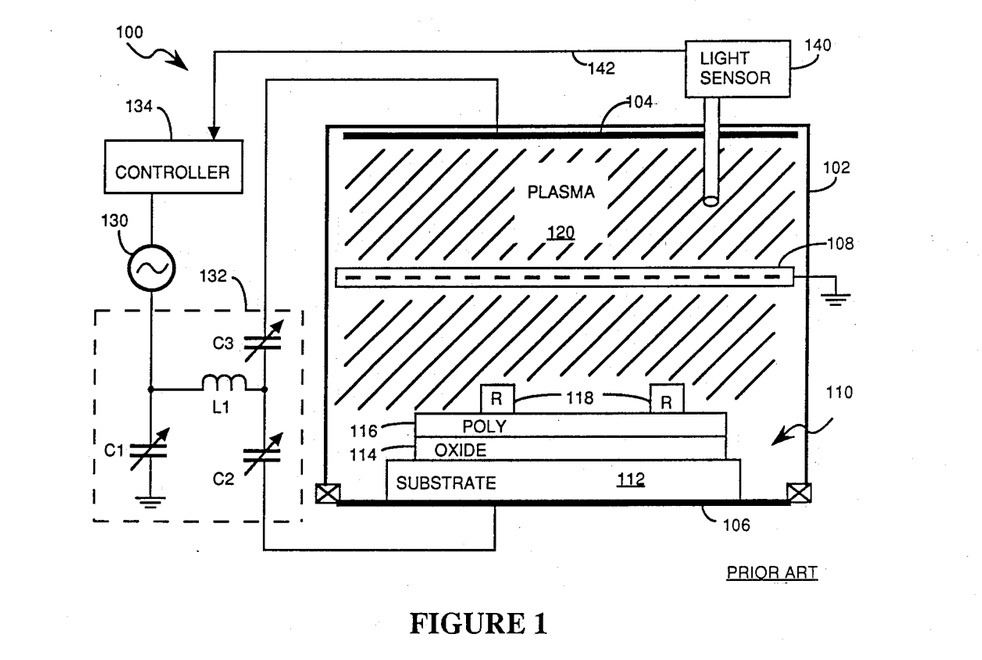
FIG. 1 is a block diagram of a prior art triode plasma etcher system.

Referring to FIG. 1, there is shown a triode etcher system 100. The system 100 has an etching chamber 102 with upper and lower cathodes 104 and 106, respectively, and a screen anode 108. The screen anode 108 is located between the two cathodes and is grounded. A semiconductor wafer 110 is placed in the chamber on the lower cathode 106. In this example the wafer 110 has a silicon substrate 112 which supports an oxide layer 114 and a polysilicon layer 116. The polysilicon layer 116 has been masked with resist 118 to define the areas of polysilicon that are to remain at the end of the etching process. The interior of the etching chamber is filled with a gaseous etching plasma 120.

The system has a 13.56 megahertz RF power supply 130 which has a characteristic impedance of 50 ohms. The chamber 102, however, has a characteristic impedance of around 1000 ohms at this frequency. Without the use of a compensating circuit, this impedance mismatch would cause most of the power output by the power supply to be reflected off the load (i.e., the chamber) and back to the source, which could damage the power supply 130. To overcome this problem, most or all etching systems using a compensating circuit 132, sometimes called an impedance transformation circuit, which matches the amplifier to the plasma. In a triode etcher such as the one shown in FIG. 1 this circuit includes an inductor coil L1 and three tunable capacitors C1, C2 and C3. A controller 134 automatically monitors the reflected power and adjusts the three capacitors until the reflected power is less than a specified threshold value, and also splits the power between the upper and lower electrodes. The exact manner in which the capacitors are adjusted in prior art devices such as the GCA Waferetch 616 triode etcher is not relevant to the present invention. As will be described in more detail below, the aspect of capacitor adjustment which is relevant to the present invention is a new method of adjusting the final adjusted capacitor values so as to improve plasma etching endpoint detection.

In general, the plasma 120 etches the top layer of the wafer 110 only when the power supply 130 is activated and when the power reflected by the plasma chamber is relatively low. Activating the power supply 130 "strikes" the plasma, and activates the etching process. While etching any particular layer, light is generated at frequencies corresponding to the chemical makeup of the layer being etched. That is, the layer being etched chemically combines with the plasma, creating predictable chemical compounds, and the light frequencies present in the plasma correspond to these chemical compounds.

In many plasma etching systems the endpoint of the etching process is detected using a light or optical sensor 140. Typically, the optical sensor 140 is set up, using narrow bandpass filters, to monitor the intensity of light at a frequency associated with the layer being etched. When the measured intensity falls below a specified threshold, indicating that etching is complete, the sensor 140 generates an endpoint signal that is transmitted over line 142 to the controller 134, which turns off the power supply 130 and thereby stops the etching process.

Figure 2:
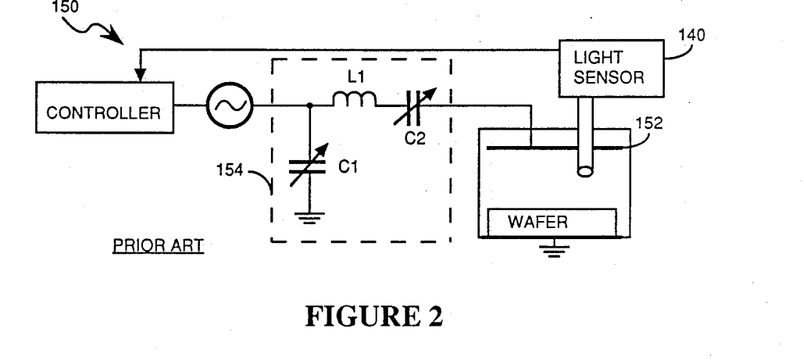
FIG. 2 is a block diagram of a prior art diode plasma etcher system.

FIG. 2 shows a plasma etcher using a diode etcher system 150 which is similar the triode system shown in FIG. 1. The primary difference is that the diode etcher has only one cathode 152, and thus has a simpler impedance transformation circuit 154 with only two tunable capacitors C1 and C2. The present invention works equally well with diode and triode etcher systems.

The problem solved by the present invention is as follows. In particular, on occasion, while etching the polysilicon gate layer of MOS devices, the gate oxide layer below the polysilicon is etched and destroyed .

before an endpoint signal is generated by the light sensor 140. This problem, which occurs with both diode and triode plasma etchers, completely destroys the wafer being etched. Therefore, even though this problem does not occur very often, it is still costly.

The inventors of the present invention have found that the problem is not due to any failure in the light sensors 140, but rather with the manner in which the impedance transformation circuit 132 or 154 is adjusted.

SUMMARY OF THE INVENTION

In summary, the present invention is an improved endpoint detection system and method for plasma etching systems. The endpoint detection system generates an endpoint signal when the etching system completes the etching of a designated layer on a semiconductor wafer and begins etching the layer below the designated layer. Using the present invention, the impedance transformation circuit is tuned so that selected tuning point has a predefined relationship to the point at which minimum power reflection occurs. As a result, when the etching system completes the etching of a designated layer, the amount of power reflected by the plasma etcher will change in a predefined fashion so as to facilitate the generation of an endpoint signal.

In one preferred embodiment, a tuning capacitor in the etcher's impedance transformation circuit is set at a level at which it is known that the amount of reflected power will increase when the designated layer has been completely etched. The increase in reflected power results in a decrease in the power used by the plasma. As a result, the intensity of the light generated in the plasma will decrease. An optical sensor monitors the intensity of light at a frequency associated with the layer being etched and generates an endpoint signal when the sensed emission intensity decreases below a specified level. That endpoint signal is used to turn off the etcher's plasma power supply. The increase in reflected power at the completion of etching of the designated layer facilitates the generation of an endpoint signal before the layer below the designated layer has been etched to any significant degree.

In a second preferred embodiment, the etcher's impedance transformation circuit is again adjusted so that the amount of reflected power will increase when the designated layer has been completely etched. In this embodiment, however, reflected power is monitored to detect when the reflected power increases above a specified level, at which point the power monitoring circuit generates an endpoint signal that is used to turn off the etcher's plasma power supply. This reduces the cost of the etching system by eliminating the need for an optical endpoint sensor.

In a third preferred embodiment, a tuning capacitor in the etcher's impedance transformation circuit is set at a level at which it is known that the reflected power will decrease when the designated layer has been completely etched. The decrease in reflected power results in an increase in the power used by the plasma. As a result, the intensity of light generated in the plasma will increase. An optical sensor monitors the intensity of light at a frequency which generated while the layer below the designated layer is being etched, and generates an endpoint signal when the sensed emission intensity increases above a specified level. Therefore, when the designated layer is completely etched and the layer below the designated layer begins to be etched, an endpoint signal is generated by the optical sensor and this endpoint signal is used to turn off the etcher's plasma power supply. The decrease in reflected power at the completion of etching of the designated layer facilitates the generation of an endpoint signal before the layer below the designated layer has been etched to any significant degree.

BRIEF DESCRIPTION OF THE DRAWINGS

Additional objects and features of the invention will be more readily apparent from the following detailed description and appended claims when taken in conjunction with the drawings, in which:

DESCRIPTION OF THE PREFERRED EMBODIMENTS

Referring to FIGS. 1 and 2, the controller 134 used in a typical plasma etcher comprises a microprocessor or microcontroller which monitors the amount of reflected power while adjusting the capacitances C1-C3 in accordance with a predefined algorithm. The present invention modifies the prior art algorithms used to select the capacitance of capacitor C2. The first three preferred embodiments of the present invention do not require modification of the hardware in the controller 134. A fourth preferred embodiment adds either hardware or software for detecting the endpoint of the etching process by comparing the sensed reflected power with a specified level indicative of the etching endpoint.

For the purposes of the present invention the term "light" is defined to include all electromagnetic radiation emissions generated in a plasma etcher which can be detected by optical sensors, even if the wavelengths of those emissions do not fall in the visible range.

An "endpoint signal" is herein defined to be a signal that either falls or rises at the endpoint of a plasma etching process. Internal to the plasma etcher, light intensity based endpoint signals that rise at endpoint are related to the concentration of reactants in the plasma chamber or the concentration of products or reactions involving the underlying material. Endpoint signals that fall at endpoint are related to the concentration of reactive intermediates or products or reactions involving the material being etched.

Figure 3:
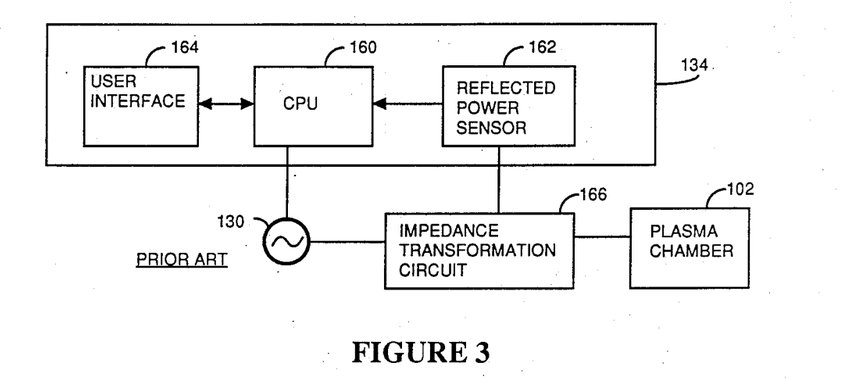
FIG. 3 is a block diagram of the controller in a prior art plasma etcher system.

Referring to FIG. 3, the controller 134 of the etcher system comprises a programmed microprocessor or microcontroller (CPU) 160, a reflected power sensor 162, and a user interface 164. In FIG. 3 the impedance transformation circuit is assigned reference numeral

166. The reflected power sensor 162 measures the amount of power reflected by the plasma chamber 102 and sends a corresponding value to the CPU 160. The user interface 164 allows a user of the system to observe the capacitor settings selected by the CPU 160 and the magnitude of the reflected power, and to specify to the CPU 160 control parameters such as a threshold reflected power value which is used while tuning the capacitor values in the impedance transformation circuit 166.

Figure 4:
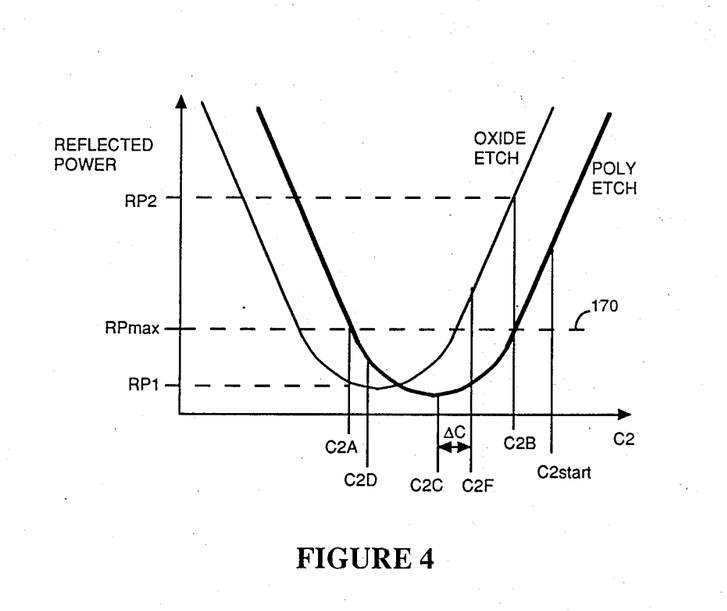
FIG. 4 depicts the relationship between reflected power in a tuned plasma etcher, and the selected capacitance of a capacitor in the etcher's impedance transformation circuit.

Referring to FIG. 4, the amount of reflected power (i.e., power reflected by the plasma chamber 102 due to impedance mismatch between the power source 130 and the chamber 102) is shown to be a function of the capacitance of the tunable capacitor C2. The relationship shown is characteristic of both the diode and triode etchers shown in FIGS. 1 and 2. The horizontal dashed line 170 indicates the maximum amount of reflected power RPmax that is allowed when the controller 134 tunes the impedance transformation circuit 166. As mentioned above, the maximum reflected power RPmax may be specified by the user via the user interface 164. In other embodiments, the maximum reflected power RPmax may be predefined as either a particular power level (e.g., 10 watts) or a predefined percentage of the input power generated by power supply 130 (e.g., 2.5 percent).

In the prior art, given a particular RPmax value the controller 134 could select any settings for the capacitors in the impedance transformation circuit 166 which resulted in the measured reflected being lower than RPmax. It was observed by the inventors of the present invention that the particular setting selected for C2 varied considerably from wafer to wafer. In other words, the value of C2 selected within the range of allowed values was somewhat random.

The graph in FIG. 4 shows two distinct curves. The darker curve represents the relationship between the capacitance of capacitor C2 and reflected power when etching polysilicon, using a particular plasma chemical mix. The lighter curve represents the relationship between the capacitance of capacitor C2 and reflected power when etching silicon oxide, using the same plasma chemical mix. The inventors have discovered that the fact that these two curves are different is very important for accurate endpoint detection.

In accordance with the prior art, given a particular specified or predetermined value for RPmax, the controller 134 was free to select any capacitance for capacitor C2 between C2A and C2B, as shown in FIG. 4. However, the operation of the etcher is actually quite different at these two settings for C2. When C2 is set at C2A, the reflected power actually decreases when the polysilicon layer has been completely etched and the etcher begins to etch silicon oxide. In the example shown in FIG. 4, the reflected power decreases from RPmax to RP1 as the etcher finished etching a polysilicon layer and begins etching the silicon oxide layer below the polysilicon.

On the other hand, when C2 is set at C2B, the reflected power increases at the endpoint of polysilicon etching. In the example shown in FIG. 4, the reflected power increases from RPmax to RP2 as the etcher finished etching a polysilicon layer and begins etching the silicon oxide layer below the polysilicon.

The amount of reflected power has been found to affect the intensity of emissions (i.e., the intensity of the light) generated by the plasma. In particular, the intensity of emissions increases when the amount of reflected power decreases; similarly, the intensity of emissions generated by the plasma decreases when the amount of reflected power increases. Thus, if the capacitance of capacitor C2 is set at C2A, the intensity of emissions generated by the plasma will actually increase when the polysilicon layer is completely etched. This increase in emission intensity applies to all the frequencies of light which are generated in the plasma. Thus, even though the intensity of the light generated at frequencies corresponding to the etching of polysilicon will decrease due to the completion of polysilicon etching, the decrease in reflected power will boost the overall intensity of the light being generated. Depending on the change in reflected power, the intensity of the light generated at the frequency of light being monitored by the optical sensor 140 may not decrease enough to trigger the generation of an endpoint signal by the optical sensor 140.

As explained above, the optical sensor 140 will generate an endpoint signal when the intensity of light at the monitored frequency decreases below a specified threshold value. At some settings of C2 the intensity of light at the monitored frequency does not fall below the threshold value even though the etching of polysilicon is completed. Therefore the plasma etcher etches through the gate oxide layer and destroys the wafer being processed.

The inventors of the present invention believe that it has been an assumption in prior art plasma etchers that the amount of reflected power would either not change significantly or would increase at the endpoint of etching the layer designated for etching. It may have been assumed that if the impedance transformation circuit 166 was tuned while etching polysilicon that the impedance transformation circuit 166 would be less well tuned when the etcher began to etch silicon oxide. However, as shown in FIG. 4, this is not necessarily the case. Since the prior art etchers were free to set the capacitance of C2 at any value between C2A and C2B, the reflected power may actually decrease when the plasma etcher begins to etch silicon oxide.

When thicker gate oxides (e.g., 500 angstroms) are used, an overall time limit on the plasma etching process may be used to prevent destruction of the oxide layer underlying the layer being etched. With thinner oxide (e.g., 200 angstroms) becoming common, an increasing number of wafers are being destroyed by failure of the plasma etcher to detect the endpoint of the etching process.

The present invention presents four alternate solutions to overcoming the endpoint detection problem in plasma etchers. These four preferred embodiments of the invention are discussed below.

FIRST PREFERRED EMBODIMENT

Figure 5:
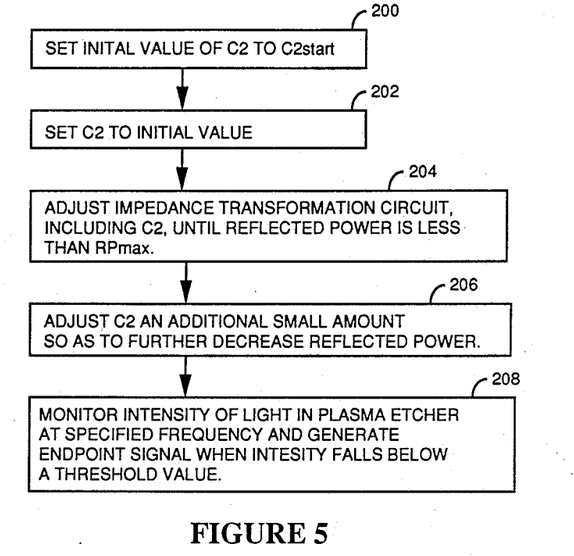
FIG. 5 is a flow chart of a control program for a first preferred embodiment of the present invention.

Referring to the flow chart FIG. 5, the first preferred embodiment of the present invention takes advantage of the fact that the standard prior art technique of selecting a C2 value is as follows. First, capacitor C2 is set at an initial value (step 202). Then all the capacitors are adjusted until reflected power is below the specified maximum value RPmax (step 204). While step 204 is performed, C2 is initially changed from its initial value as little as possible so as to decrease reflected power below RPmax. Then C2 is adjusted a small additional amount so as to make sure that the reflected power is well below RPmax (step 206). Finally, the optical sensor generates an endpoint signal when the intensity of light at a monitored light frequency falls below a threshold value and the power supply 130 is turned off (step 208).

As can be seen by looking at FIG. 4, the adjusted value of C2 using this method of adjusting the impedance compensating circuit will be highly dependent on the initial value of C2. If the initial value of C2 corresponds to a reflected power level below RPmax, C2 will usually not be adjusted very much at all. If the initial value of C2 is higher than the range of acceptable C2 values, then the adjusted C2 will be at a point between C2B and C2C, where C2C is the value of C2 at which reflected power is minimized. In this case, the optical sensor 140 will generate an endpoint signal at the proper time at the conclusion of polysilicon etching.

If the initial value of C2 is lower than the range of acceptable C2 values, then the adjusted C2 will be at a point between C2A and C2C, where C2C is the value of C2 at which reflected power is minimized. If the adjusted C2 value is C2D, then the reflected power will decrease at the endpoint of polysilicon etching, and the endpoint signal from the optical sensor 140 may be suppressed.

In this first preferred embodiment, the prior art technique of adjusting C2 is modified by adding step 200 at the beginning of the process. In step 200, C2 is given an initial value C2start which is higher than the range of acceptable C2 values. Typically C2start will be provided by the user via the user interface 164. However, the value of C2start may also be generated automatically by the controller 134 by programming the controller to first select a value of C2 that is higher than the range of C2 values at which reflected power is below RPmax, and then to perform the standard algorithm for adjusting C2.

SECOND PREFERRED EMBODIMENT

Figure 6:
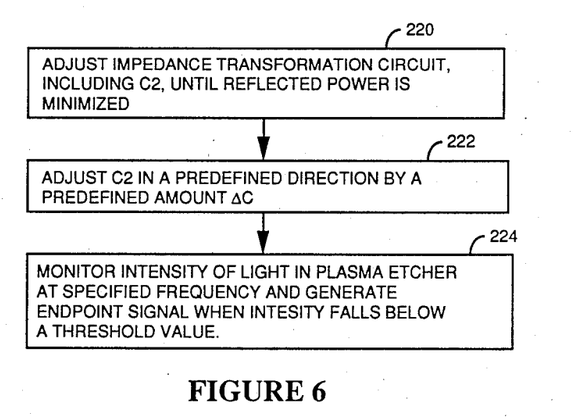
FIG. 6 is a flow chart of a control program for a second preferred embodiment of the present invention.

Referring to the flow chart FIG. 6, in the second preferred embodiment the prior art algorithm for adjusting C2 is totally replaced with the following steps. First, the controller 134 adjusts C2 until it finds the value of C2 which corresponds to the minimum reflected power (step 220). This value of C2 is labelled C2C in FIG. 4. Then C2 is increased by a predefined amount ΔC to a value of C2F (step 222). When capacitor C2 is set to a value of C2F it is guaranteed that the reflected power will increase at the conclusion of polysilicon etching. The final step of the process (step 224) is normal endpoint detection by the optical sensor 140.

THIRD PREFERRED EMBODIMENT.

Figure 7:
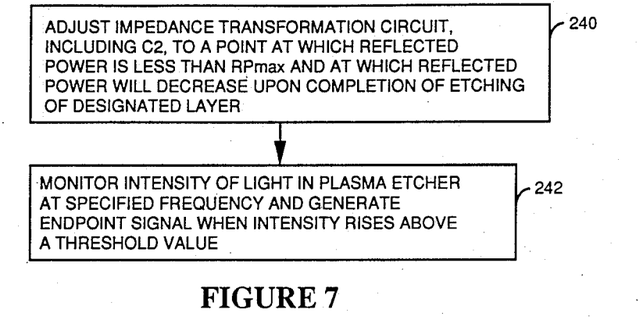
FIG. 7 is a flow chart of a control program for a third preferred embodiment of the present invention.

Referring to the flow chart FIG. 7, in the third preferred embodiment the prior art algorithm for adjusting C2 is replaced with the following steps. First, the controller 134 adjusts C2 to value C2D, shown in FIG. 4, at which point the reflected power will decrease at the completion of polysilicon etching (step 240). This can be done in either of two ways: (a) by selecting a starting C2 value which is lower than the range of C2 values at which reflected power is below RPmax, or (b) by first adjusting C2 to C2C at which reflected power is minimized and then by decreasing C2 past the point at which the curves for polysilicon and oxide etching cross. The final step 242 is the opposite of normal endpoint detection. The optical sensor 140 is tuned to monitor the intensity of light at a frequency corresponding to the etching of oxide (i.e., the layer below the layer being etched). When the monitored intensity increases above a threshold value, the optical sensor 140 generates an endpoint signal and the power supply 130 is turned off.

FOURTH PREFERRED EMBODIMENT

Figure 8:
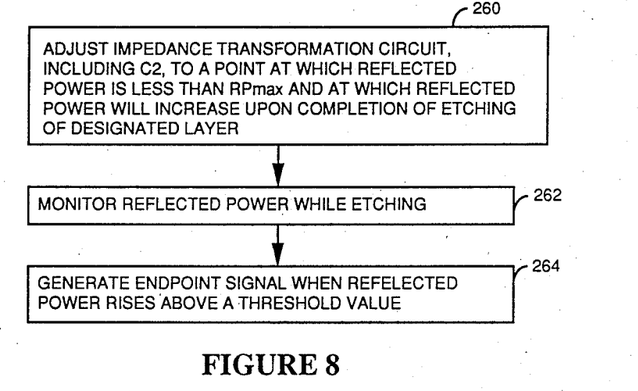
FIG. 8 is a flow chart of a control program for a fourth preferred embodiment of the present invention.

Referring to FIG. 8, in the fourth preferred embodiment, the value of C2 is set to a value between C2C and C2D using the techniques of either the first or second preferred embodiments, described above (step 260). However, endpoint detection is performed using a new technique. In particular, the reflected power is monitored during etching (step 262) and when the reflected power exceeds a threshold value an endpoint signal is generated and the power supply 130 is turned off (step 264).

Referring to FIG. 3, the fourth preferred embodiment can be implemented by changing the software for the CPU 160 in the controller 134. The CPU 160 repeatedly reads in the digital value generated by the reflected power sensor 162 during etching and compares that value with a threshold value. The threshold value may be either a specified power value, a percentage of the input power generated by power supply 130 (e.g., 10 percent), or a power differential value corresponding to the amount of increase in the reflected power which corresponds to the completion of etching of the designated layer. Each of these types of threshold values may be either predefined by the CPU's software or specified by a user via the user interface 164.

Figure 9:
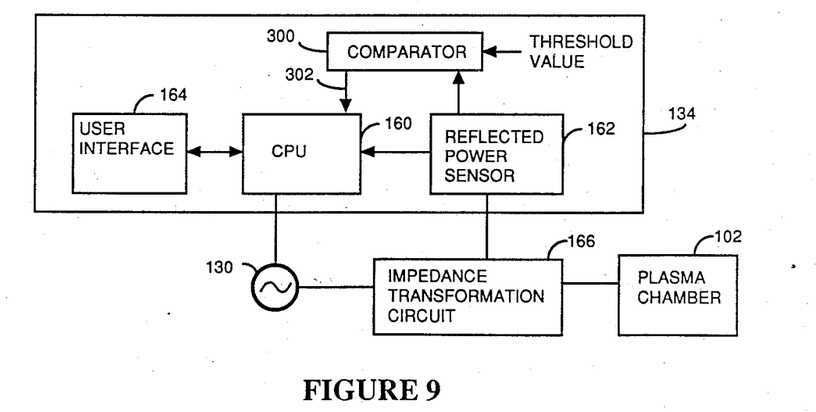
FIG. 9 is a block diagram of a fourth preferred embodiment of the present invention.

Referring to FIG. 9, there is shown a hardware implementation of the fourth preferred embodiment. In this embodiment a comparator 300 compares the reflected power with a threshold value and generates an endpoint signal on line 302 when the reflected power exceeds the threshold value. The CPU 160 receives the endpoint signal and turns off the power supply 130 so as to stop the plasma etching process. Either implementation of the fourth preferred embodiment reduces the cost of the etching system by eliminating the need for an optical endpoint sensor.

ALTERNATE EMBODIMENTS.

It should be noted that the present invention is not limited to plasma etching of the polysilicon layers in MOS circuits. The present invention is applicable to plasma etching of many types of materials. It should be noted that the reflected power functions for the designated layer being etched and the layer below that layer will differ from material to material. Therefore the method of selecting or adjusting the impedance transformation circuit 166 will depend on the materials being etched. In general though, in accordance with the present invention the impedance transformation circuit 166 should be adjusted so that the change in reflected power at the endpoint of the etching process facilitates the generation of an endpoint signal.

It may be noted that, rather than adjusting the impedance transformation circuit, it may be possible to achieve similar results by adjusting the load (i.e., the load associated with the plasma) to create a specified mismatch between the impedance of the power supply and the load. As will be understood by those skilled in the art, the load can be adjusted by adjusting the pressure in the plasma chamber or by adjusting other ones of the process parameters so as to increase or decrease the impedance of the load. Referring to FIG. 4, the above described preferred embodiments effectively keep the power reflection curves fixed and shift the X-axis; adjusting the characteristics of the load shifts the curves while keeping the X-axis constant. However, the inventor believes that successful implementation of this load adjustment method will still require some adjustment of the power supply's impedance in order to reliably generate a specified impedance mismatch at the endpoint of the etching process which facilitates the generation of an endpoint signal.

While the present invention has been described with reference to a few specific embodiments, the description is illustrative of the invention and is not to be construed as limiting the invention. Various modifications may occur to those skilled in the art without departing from the true spirit and scope of the invention as defined by the appended claims.

What is claimed is:

1. A plasma etching system, comprising:
   plasma etching means for etching a target having a designated layer to be etched and a underlying layer below said designated layer;
   power supply means coupled to said plasma etching means for providing power to said plasma etching means;
   impedance transformation means coupling said power supply means to said plasma etching means, said impedance transformation means including adjustment means for adjusting the impedance of said impedance transformation means;
   reflected power monitoring means for monitoring the amount of power from said power supply means reflected by said plasma etching means;
   control means, coupled to reflected power monitoring means and said adjustment means of said impedance transformation means, for adjusting the impedance of said impedance transformation means so that the amount of reflected power reflected by said plasma etching means increases when said plasma etching means completes the etching of said designated layer and begins etching said underlying layer; and
   endpoint detection means, coupled to said plasma etching means, for detecting when said plasma etching means completes the etching of said designated layer and begins etching said underlying layer.

2. The plasma etching system set forth in claim 1, said endpoint detection means comprising optical sensor means for monitoring the intensity of light in said plasma etching means at a specified frequency and for generating an endpoint signal when said monitored intensity falls below a threshold level;
   said control means including means, coupled to said endpoint detection means and said power supply means, for turning off said power supply means when said endpoint signal is generated.

3. The plasma etching system set forth in claim 1, said endpoint detection means comprising comparator means, coupled to said reflected power monitoring means, for comparing the amount of power reflected by said plasma etching means with a threshold value and for generating an endpoint signal when said monitored amount of reflected power rises above said threshold value;
   said control means including means, coupled to said endpoint detection means and said power supply means, for turning off said power supply means when said endpoint signal is generated.

4. The plasma etching system set forth in claim 1, said endpoint detection means comprising means, coupled to said reflected power monitoring means, for comparing the amount of power reflected by said plasma etching means with a threshold value and for turning off said power supply means when said monitored amount of reflected power rises above said threshold value.

5. A plasma etching system, comprising:
   plasma etching means for etching a target having a designated layer to be etched and a underlying layer below said designated layer;
   power supply means coupled to said plasma etching means for providing power to said plasma etching means;
   impedance transformation means coupling said power supply means to said plasma etching means, said impedance transformation means including adjustment means for adjusting the impedance of said impedance transformation means;
   reflected power monitoring means for monitoring the amount of power from said power supply means reflected by said plasma etching means;
   control means, coupled to reflected power monitoring means and said adjustment means of said impedance transformation means, for adjusting the impedance of said impedance transformation means so that the amount of reflected power reflected by said plasma etching means decreases when said plasma etching means completes the etching of said designated layer and begins etching said underlying layer; and
   endpoint detection means, coupled to said plasma etching means, for detecting when said plasma etching means completes the etching of said designated layer and begins etching said underlying layer.

6. The plasma etching system set forth in claim 5, said endpoint detection means comprising optical sensor means for monitoring the intensity of light in said plasma etching means at a specified frequency, corresponding to etching said underlying layer, and for generating an endpoint signal when said monitored intensity rises above a threshold level;
   said control means including means, coupled to said endpoint detection means and said power supply means, for turning off said power supply means when said endpoint signal is generated.

7. A method of detecting the completion of etching of a designated layer of material in a plasma etching system, the steps of the method comprising:
   placing a target having a designated layer to be etched and a underlying layer below said designated layer in a plasma etching chamber;
   coupling a power supply means to said plasma etching chamber with an adjustable impedance circuit,
   enabling said power supply to provide power to said plasma etching chamber;
   monitoring the amount of power from said power supply means reflected by said plasma etching chamber;
   adjusting the impedance of said adjustable impedance circuit so that the amount of reflected power reflected by said plasma etching chamber will increase when said plasma etching chamber completes the etching of said designated layer and begins etching said underlying layer; and
   detecting when said plasma etching chamber completes the etching of said designated layer and begins etching said underlying layer.

8. The plasma etching method set forth in claim 7, said detecting step including the steps of:
   monitoring the intensity of light in said plasma etching chamber at a specified frequency;
   generating an endpoint signal when said monitored intensity falls below a threshold level; and
   turning off said power supply when said endpoint signal is generated;
   wherein said specified frequency corresponds to light generated by said plasma etching chamber while etching said designated layer.

9. The plasma etching method set forth in claim 7, said detecting step including the steps of:
   comparing the amount of power reflected by said plasma etching chamber with a threshold value;
   turning off said power supply when said monitored amount of reflected power rises above said threshold value.

10. The plasma etching method set forth in claim 7, said detecting step including the steps of:
    comparing the amount of power reflected by said plasma etching chamber with a threshold value;
    generating an endpoint signal when said monitored amount of reflected power rises above a threshold level;
    turning off said power supply when said endpoint signal is generated.

11. A method of detecting the completion of etching of a designated layer of material in a plasma etching system, the steps of the method comprising:
    placing a target having a designated layer to be etched and a underlying layer below said designated layer in a plasma etching chamber;
    coupling a power supply means to said plasma etching chamber with an adjustable impedance circuit,
    enabling said power supply to provide power to said plasma etching chamber;
    monitoring the amount of power from said power supply means reflected by said plasma etching chamber;
    adjusting the impedance of said adjustable impedance circuit so that the amount of reflected power reflected by said plasma etching chamber will decrease when said plasma etching chamber completes the etching of said designated layer and begins etching said underlying layer; and
    detecting when said plasma etching chamber completes the etching of said designated layer and begins etching said underlying layer.

12. The plasma etching method set forth in claim 11, said detecting step including the steps of:
    monitoring the intensity of light in said plasma etching chamber at a specified frequency;
    generating an endpoint signal when said monitored intensity rises above a threshold level; and
    turning off said power supply when said endpoint signal is generated;
    wherein said specified frequency corresponds to light generated by said plasma etching chamber while etching said underlying layer.

* * * * *